(12) United States Patent
Tsai et al.

(10) Patent No.: US 6,509,581 B1
(45) Date of Patent: Jan. 21, 2003

(54) STRUCTURE AND FABRICATION PROCESS FOR AN IMPROVED POLYMER LIGHT EMITTING DIODE

(75) Inventors: Chun-Hui Tsai, Hinchu (TW); Lai-Cheng Chen, Hinchu (TW); Chuo-Chi Peng, Hinchu (TW)

(73) Assignee: Delta Optoelectronics, Inc., Hsinchu (TW)

( * ) Notice: Subject to any disclaimer, the term of this patent is extended or adjusted under 35 U.S.C. 154(b) by 0 days.

(21) Appl. No.: 09/538,381

(22) Filed: Mar. 29, 2000

(51) Int. Cl.$^7$ .......................... H01L 35/24; H01L 51/00
(52) U.S. Cl. ........................ 257/40; 438/82; 438/99
(58) Field of Search ................. 438/82, 99; 257/40

(56) References Cited

U.S. PATENT DOCUMENTS

| | | | | |
|---|---|---|---|---|
| 5,652,067 A | * | 7/1997 | Ito et al. | 428/690 |
| 5,804,836 A | * | 9/1998 | Heeger et al. | 257/40 |
| 6,064,091 A | * | 5/2000 | Deane et al. | 257/347 |
| 6,252,246 B1 | * | 6/2001 | Arai et al. | 257/40 |

FOREIGN PATENT DOCUMENTS

JP        360028278 A    *   2/1985

* cited by examiner

*Primary Examiner*—Eddie Lee
*Assistant Examiner*—Paul E Brock, II
(74) *Attorney, Agent, or Firm*—Bo-In Lin

(57) ABSTRACT

The present invention discloses an organic light-emitting diode (LED). The organic light emitting diode is supported on an indium/tin oxide 110 (ITO) coated glass substrate 105. The organic light-emitting diode includes an amorphous-silicon (α-Si) resistive layer 115 covering the ITO 110 coated glass substrate 105. The organic light-emitting diode 100 further includes a polyaniline (PANI) layer 120 covering the amorphous silicon (α-Si) resistive layer 115 and an organic light emitting layer 125 overlying the PANI layer 120. And, the organic light-emitting diode 100 further has a conductive electrode layer 130 covering the light emitting layer 125. In a preferred embodiment, the amorphous silicon (α-Si) resistive layer 115 functioning as a current limiting layer for limiting a current density conducted between the ITO 110 coated glass substrate 105 and the conductive electrode layer 130 under a maximum allowable current density of 1000 mA/cm$^2$. In another preferred embodiment, the amorphous silicon (α-Si) resistive layer 115 functioning as a current distribution layer for distributing a current conducted between the ITO coated glass substrate and the conductive electrode layer. Thus, the difference between a greatest current density from a smallest current density is under a maximum allowable current density difference of 1000 mA/cm$^2$. In summary, this invention discloses an organic light-emitting diode (LED) 100 that includes an inorganic layer 115 functioning as a current limiting layer.

4 Claims, 5 Drawing Sheets

STRUCTURE AND FABRICATION PROCESS FOR AN IMPROVED POLYMER LIGHT EMITTING DIODE

BACKGROUND OF THE INVENTION

1. Field of the Invention

This invention relates generally to the structure and fabrication process of an organic light emitting diode. More particularly, this invention relates to an improved layer structure and method of manufacture for an organic light-emitting LED device applicable for flat panel display applications with extended operational life and reliable light-emitting performance.

2. Description of the Prior Art

A technical difficulty is still confronted by the manufacturers of flat panel devices because a long-term reliable operation of the organic light-emitting diodes (LED) is not yet achievable. For the purpose of forming an organic LED, an active organic luminescent layer is sandwiched between a transparent anode, e.g., an indium/tin oxide (ITO) layer, as a hole-injecting contact and a low work function metal as electron injecting contacts, as that described below as that shown in FIG. 1. The active organic layer may be a conductive polymer. However, there is a difficulty faced by those applying the organic LEDs for display applications, because the operational life for a typical organic LED is still quite limited. Due to the difficulties of layer structure integrity, as will be further explained, degradation of display quality and reduction in brightness often occur after the organic light emitting device is deployed for service for only a limited period of time.

FIG. 1A shows the layer structure of a conventional light emitting diode. An organic light emitting layer 3 is deposited over an indium/tin oxide (ITO) layer 2 supported on a glass substrate 1. The ITO layer 2 serves the function as anode with a metal layer 4 overlying the organic light-emitting layer 3 functioning as a cathode electrode connected to a negative voltage of three to nine volts (−3V to −9V) to induce the light emitting function of the layer 3. The light emitting organic layer 3 can be a single layer or a multiple-layer structure with a thickness less than 100 nm. Because of this very small thickness, the light-emitting organic layer is vulnerable to manufacture defects of pinholes or damages when dust particles incidentally settle over the top or underneath the light-emitting organic layer 3. The anode electrode, i.e., the ITO layer 2 is shorted to the cathode-electrode metal layer 4 when the pinholes are presented in the light-emitting layer 3. Malfunctions of the light-emitting flat panel device become a difficult problem faced by those of ordinary skill in the art involved in making display devices by applying techniques of light-emitting diode implemented with organic light emitting layers of very small layer thickness.

Zhang et al. disclose in an U. S. Pat. No. 5,798,170, entitled "Long Operating Life for Polymer Light Emitting Diodes" a light emitting diode with improved resistance to blurring spreading or degradation over time.

As shown in FIGS. 1B and 1C, a polymer light-emitting diode device 20 is disclosed in this patent that includes an electronic injecting cathode contact 12 that can be a relatively low work function metal such as calcium. The cathode contact 12 is disposed on top of semi-conductive and luminescent conjugated polymer film 14 supported on a substrate 18. The substrate 18 is partially coated with a transparent conductive layer 16 having a higher work function, i.e., a high ionization potential to serve as the electron withdrawing anode electrode. The light emitting diode configuration is then improved by placing a layer 15 containing polyaniline, i.e., PANI, emeraldine salt to interpose between the luminescent film 14 and electrode 16. FIG. 1C shows an alternate embodiment of the patented device 10 by employing the PANI layer 15 as the electron withdrawing anode electrode wherein the PANI layer 15 contains emeraldine salt of high conductivity. Improved performance over a longer life is achieved because the emeraldine salt containing layer 15 with certain sheet resistance can stabilize the device performance and prevent degradation of efficiency loss in forming the dark non-emitting spots.

The usefulness of employing a polyaniline layer containing various level of resistance of emeraldine-salt, as disclosed by Zhang et al., is however limited by the difficulties that PANI layer is not suitable to function as an intermediate layer. The difficulties arise from the facts high level of uniformity of PANI layer thickness and density distribution cannot be precisely controlled. Problems of pinhole damages may still occur. Due to these difficulties, even with a PANI layer as suggested by Zhang et al., the problems of short-circuit between the anode and cathode and device malfunctions cannot be totally prevented.

Therefore, a need still exists in the art of design and manufacture of flat panel display by employing the organic light emitting diodes. More specifically, a need still exists in the art to provide an organic light-emitting diode with a layer structure that can reduce the vulnerability to the pinhole problems. Such layer structure must also provide a current limiting capability for protecting the device from damages due to a large current conducting between the anode and cathode. Moreover, the light-emitting device further requires a current distribution layer to reduce the uneven distributions of current densities such that the degradation of device performance caused by uneven current density distributions can be minimized.

SUMMARY OF THE PRESENT INVENTION

It is therefore an object of the present invention to provide a new layer structure and manufacture method for manufacturing an organic light-emitting diode capable of reliable long-term operation without degradation. The vulnerability to pinhole problems and uneven current distributions are reduced such that aforementioned difficulties and limitations encountered in the prior art can now be overcome.

Specifically, it is an object of the present invention to provide an improved layer structure with a new intermediate inorganic layer that has strong resistance to layer damages caused by fine particles such that the improved layer structure can reduce the vulnerability to pinholes problems.

Another object of the present invention is to provide a new and improved layer structural for an organic light-emitting diode with an inorganic intermediate layer serving as a current limiting layer. Device damages caused by current exceeding a maximum current density are prevented.

Another object of the present invention is to provide a new and improved layer structural for an organic light-emitting diode with an inorganic intermediate layer serving as a current distribution layer. Device performance degradation caused by uneven current density distribution after a long term operation is reduced by more evenly distributing the current density over the entire surface of the light-emitting diode.

Briefly, in a preferred embodiment the present invention includes an organic light-emitting diode (LED). The descriptions below are denoted with numeral designations, which are depicted in FIG. 2 described below. The organic light emitting diode is supported on an indium/tin oxide 110 (ITO) coated glass substrate 105. The organic light-emitting diode includes an amorphous-silicon (α-Si) resistive layer 115 covering the ITO 110 coated glass substrate 105. The organic light-emitting diode 100 further includes a polyaniline (PANI) layer 120 covering the amorphous silicon (α-Si) resistive layer 115 and an organic light emitting layer 125 overlying the PANI layer 120. And, the organic light-emitting diode 100 further has a conductive electrode layer 130 covering the light emitting layer 125. In a preferred embodiment, the amorphous silicon (α-Si) resistive layer 115 functioning as a current limiting layer for limiting a current density conducted between the ITO 110 coated glass substrate 105 and the conductive electrode layer 130 under a maximum allowable current density of 1000 mA/cm$^2$. In another preferred embodiment, the amorphous silicon (α-Si) resistive layer 115 functioning as a current distribution layer for distributing a current conducted between the ITO coated glass substrate and the conductive electrode layer. Thus, the difference between a greatest current density from a smallest current density is under a maximum allowable current density difference of 1000 mA/cm$^2$. In summary, this invention discloses an organic light-emitting diode (LED) 100 that includes an inorganic layer 115 functioning as a current limiting layer.

These and other objects and advantages of the present invention will no doubt become obvious to those of ordinary skill in the art after having read the following detailed description of the preferred embodiment which is illustrated in the various drawing figures.

DETAILED DESCRIPTION OF THE PREFERRED EMBODIMENT

Figure 1A:
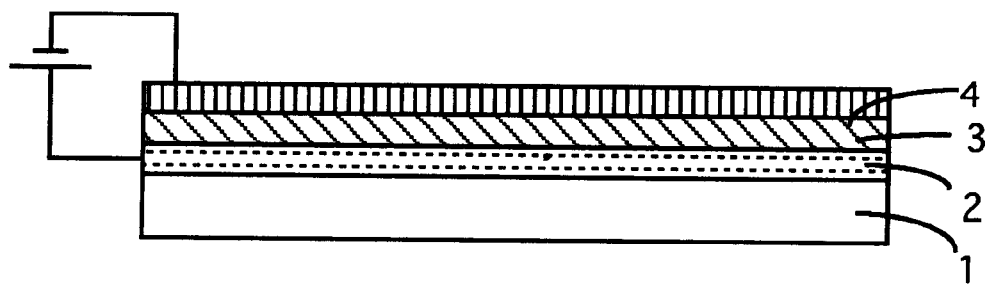
FIG. 1A is a cross sectional view of a conventional organic light-emitting diode.
Figure 1B:
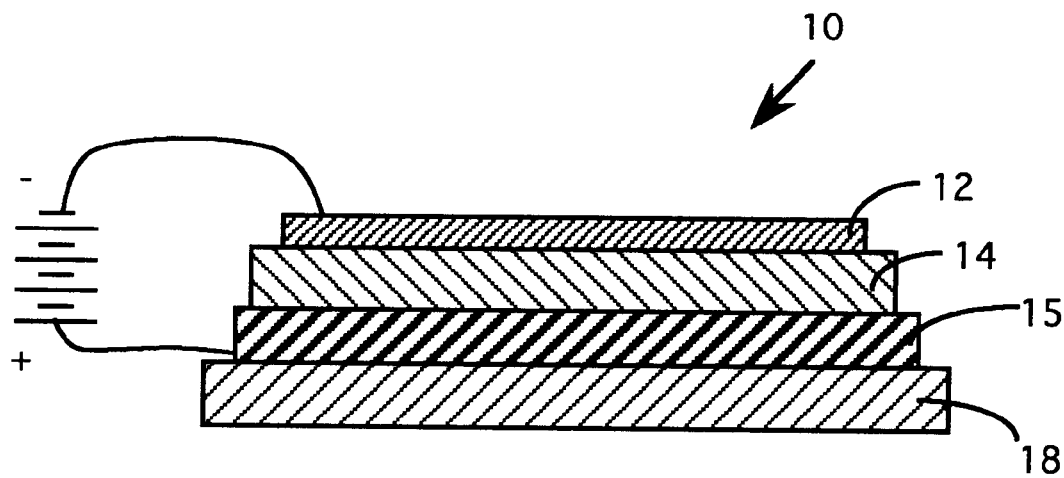
FIGS. 1B and 1C are cross sectional views of two prior art organic light-emitting diodes.
Figure 1C:
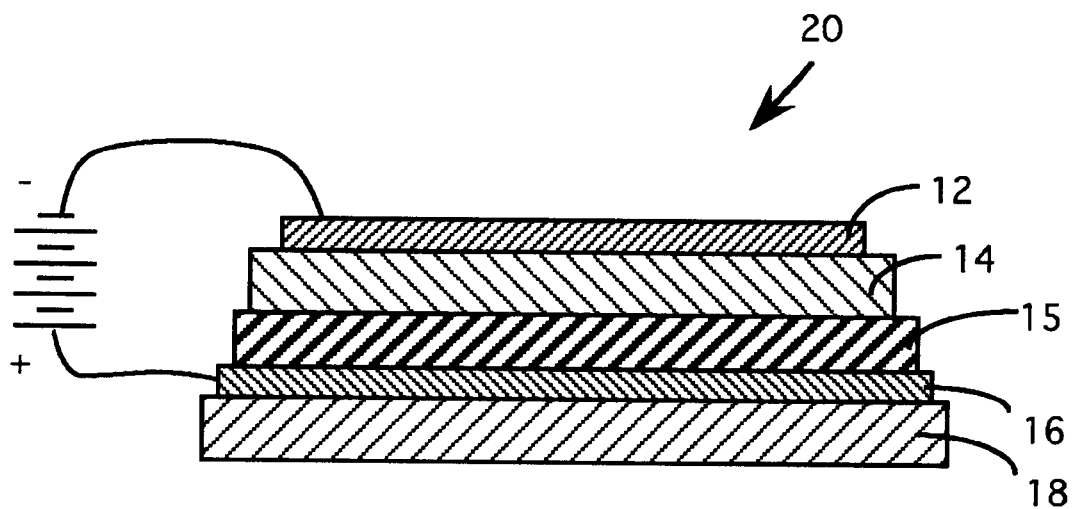
Figure 2:
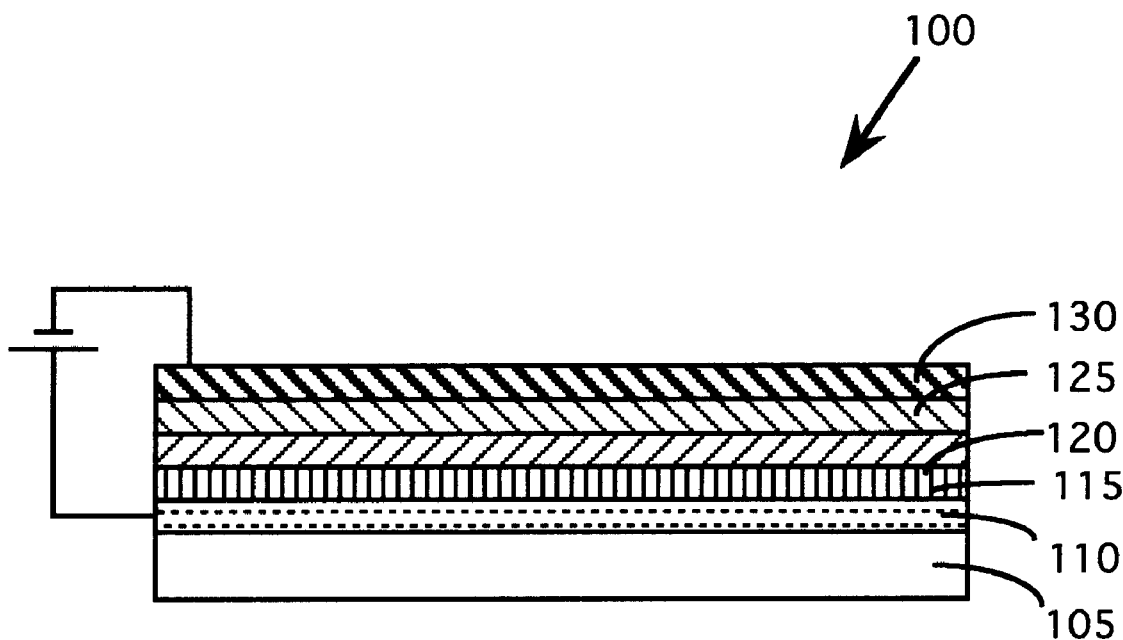
FIG. 2 is a cross sectional view of an organic light-emitting diode of this invention.

FIG. 2 is a cross sectional view of an organic light-emitting diode 100 of the present invention. The organic light-emitting diode 100 is formed on a glass substrate 105. An indium/tin oxide (ITO) layer 110 is formed on top of the glass substrate 105. An inorganic resistive layer 115 covers the ITO layer 110. This inorganic resistive layer 115 completely covers the ITO layer 110. A PANI or a PEDT/PSS (polyethylene dioxythiophene polystyrene sulphonate) layer 120 is formed on top of the inorganic resistive layer 115. An organic light emitting layer 125 is then coated over the PANI layer 120 and covered by a Ca/Al or Mg/Ag layer 130 to function as an electrode for the light emitting diode.

In a preferred embodiment, the inorganic resistive layer 115 may be a layer of amorphous silicon. This resistive layer may also be an amorphous indium/tin oxide (ITO) or indium/zirconium oxide (IZO) layer, or other type of thin film resistive layer. The sheet resistance is between $10^3$ ohms/cm$^2$ to $10^8$ ohms/cm$^2$. A sputtering deposition, plasma-vapor deposition (PVD), or a plasma-enhanced chemical vaporization deposition (PECVD) process may be applied to form the thin resistive layer 115. The purpose of adding this non-organic resistive layer is to limit the current for protecting the device. The current is limited under a maximum allowable current under the circumstances when a short circuit situation occurs between the anode and the cathode electrodes. With this current limiting resistive layer, even when an anode electrode is shorted to a cathode electrode, damages to the components of the light-emitting diode can be prevented because the short-circuit current is limited below a maximum allowable current Meanwhile, the display brightness and uniformity will not be adversely affected when the currents passed through the shorted spots are limited to a maximum allowable current In addition to serve a protective function, the resistive layer 115 also enhance a uniform distribution of current flowing between the anode and the cathode electrode. More uniform current density distribution over the entire surface of the LED device is achieved with this inorganic resistive layer serving as a current limiting and distribution layer. The display uniformity is improved because a more uniform current density is achieved. The brightness of display is improved. Furthermore, a more uniform current density distribution also improves and extends the useful life of the LED device by reducing spot degradation caused by continuous operations with uneven current density distributions.

According to FIG. 2, an organic light-emitting diode (LED) is disclosed in this invention. The organic light emitting diode is supported on an indium/tin oxide 110 (ITO) coated glass substrate 105. The organic light-emitting diode includes an amorphous-silicon (α-Si) resistive layer 115 covering the ITO 110 coated glass substrate 105. The organic light-emitting diode 100 further includes a polyaniline (PANI) layer 120 covering the amorphous silicon (α-Si) resistive layer 115 and an organic light emitting layer 125 overlying the PANI layer 120. And, the organic light-emitting diode 100 further has a conductive electrode layer 130 covering the light emitting layer 125. In a preferred embodiment, the amorphous silicon (α-Si) resistive layer 115 functioning as a current limiting layer for limiting a current density conducted between the ITO 110 coated glass substrate 105 and the conductive electrode layer 130 under a maximum allowable current density of 1000 mA/cm$^2$. In another preferred embodiment the amorphous silicon (α-Si) resistive layer 115 functioning as a current distribution layer for distributing a current conducted between the ITO coated glass substrate and the conductive electrode layer. Thus, the difference between a greatest current density from a smallest current density is under a maximum allowable current density difference of 1000 mA/cm$^2$. In summary, this invention discloses an organic light-emitting diode (LED) 100 that includes an inorganic layer 115 functioning as a current limiting layer.

Figure 3A:
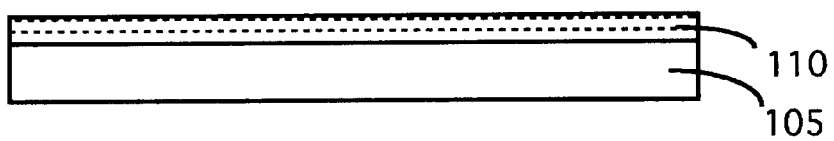
FIGS. 3A to 3E are a series of cross sectional views for showing the processing steps for manufacturing an organic light-emitting diode of FIG. 2.
Figure 3B:
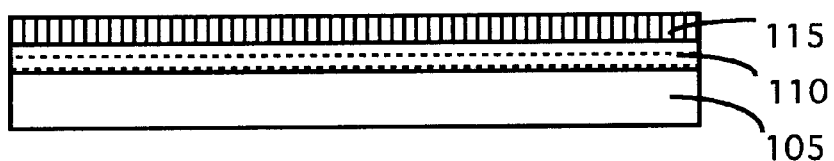
Figure 3C:
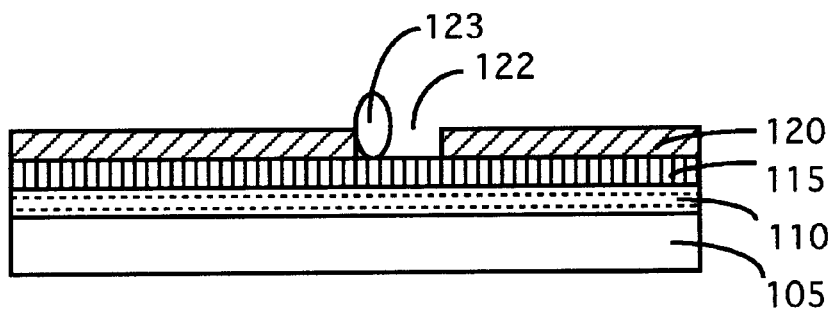
Figure 3D:
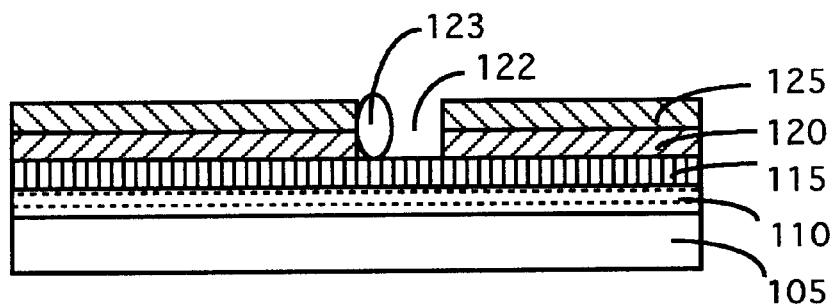
Figure 3E:
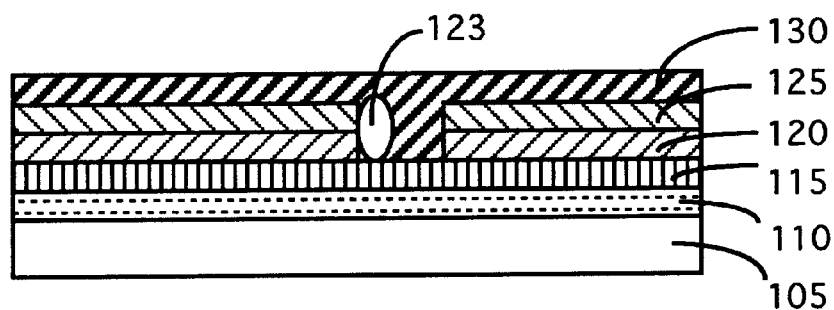

FIGS. 3A to 3E show the processing steps for manufacturing the light-emitting diode of FIG. 2. In FIG. 3A, an ITO layer 110 is formed on the glass substrate 105 by applying a sputtering deposition process. Then, in FIG. 3B, a PVD or a PECVD process is employed to form the inorganic α-silicon layer 115 on top of the ITO layer 110. A spin-on process is applied to form the PANI layer 120 over the inorganic silicon layer 115. In forming the PANI layer 120, as shown in FIG. 3C, a pinhole 122 is formed due to the contamination of a dust particle 123. Then a spin-on process is applied again to form an organic light emitting layer 125 as shown in FIG. 3D. Additional pinholes are formed in the process of forming the organic light emitting layer 125. Then a metal cathode layer 130 is formed by a vacuum evaporation method. The metal cathode layer may fill in the pinholes 123 and contact the inorganic silicon layer. The inorganic a-silicon layer 115 with specific resistance thus serves as a current limiting layer to limit the current below a maximum current such that damages to the light emitting diode can be prevented and the problems caused by particle contamination as shown can be resolved.

Figure 4:
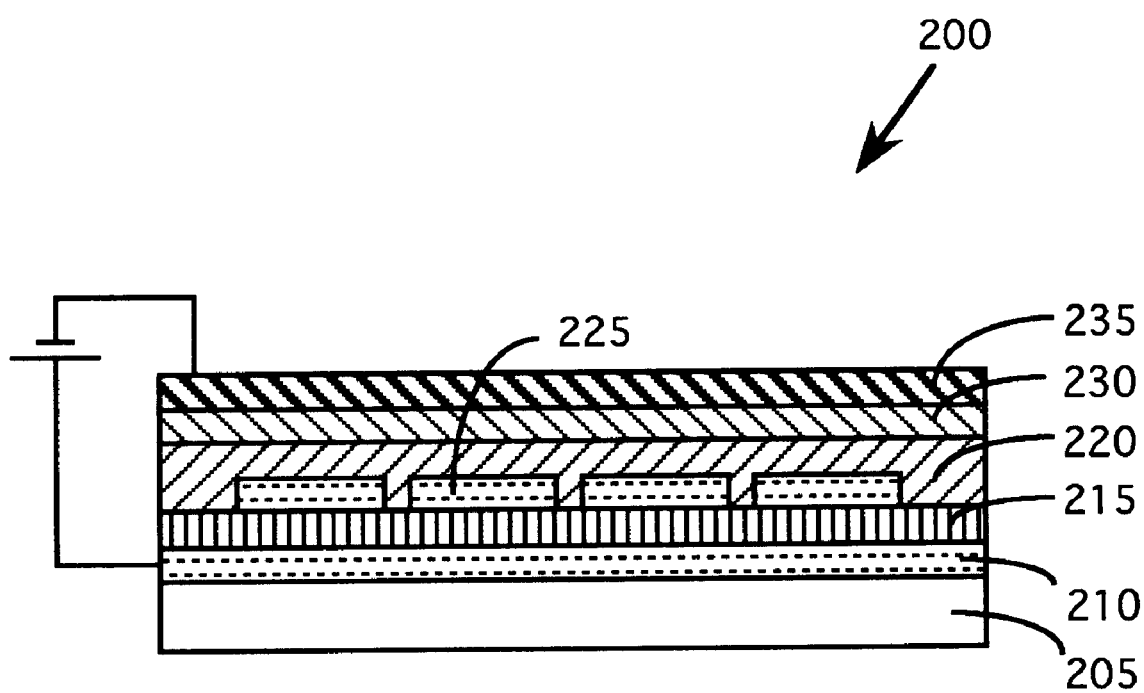
FIG. 4 is a cross sectional view of another organic light-emitting diode of this invention.

FIG. 4 is a cross sectional view of another preferred embodiment of an organic light emitting diode 200 of the present invention. The basic layer structure is substantially the same as that described for FIG. 2 with the only difference that the is are many ITO islands formed on top of the inorganic amorphous silicon layer. The organic light-emitting diode 200 is formed on a glass substrate 205. An indium/tin oxide (ITO) layer 210 is formed on top of the glass substrate 205. An inorganic resistive α-Si layer 215 covers the ITO layer 210. This inorganic α-Si resistive layer 215 completely covers the ITO layer 210. Then a plurality of ITO islands 225 are formed on top of the inorganic n-is resistive layer 215. A PANI or a PEDT/PSS (polyethylene dioxythiophene polystyrene sulphonate) layer 220 is formed on top of and between the ITO islands 220. An organic light emitting layer 230 is then coated over the PANI layer 220 and covered by a Ca/Al or Mg/Ag layer 235 to function as an electrode for the light emitting diode.

According to above descriptions, this invention further discloses a method for forming an organic light-emitting diode (LED) on an indium/tin oxide (ITO) coated glass substrate. The method includes steps of a) forming amorphous silicon (α-Si) resistive layer covering the ITO coated glass substrate; b) forming a polyaniline (PANI) layer covering the amorphous silicon (α-Si) resistive layer and an organic light emitting layer overlying the PANI layer; and c) forming a conductive electrode layer covering the light emitting layer. In a preferred embodiment the step of forming the amorphous silicon (α-si) resistive layer comprising a step of forming the amorphous silicon (α-Si) resistive layer as a current limiting layer for limiting a current density conducted between the ITO coated glass substrate and the conductive electrode layer under a maximum allowable current density. In another preferred embodiment, the step of forming the amorphous silicon (α-Si) resistive layer comprising a step of forming as a current distribution layer for distributing a current conducted between the ITO coated glass substrate and the conductive electrode layer such that a difference between a greatest current density from a smallest current density is under a maximum allowable current density difference. In another preferred embodiment the step of forming the amorphous silicon (α-Si) resistive layer as a current limiting layer comprising a step of forming the current limiting layer for limiting a current density conducted between the ITO coated glass substrate and the conductive electrode layer under a maximum allowable current density of 1000 mA/cm$^2$. In another preferred embodiment the step of forming the amorphous silicon (α-Si) resistive layer comprising a step of forming as a current distribution layer for distributing a current conducted between the ITO coated glass substrate and the conductive electrode layer such that a difference between a greatest current density from a smallest current density is under a maximum allowable current density difference of 1000 mA/cm$^2$. In another preferred embodiment, the method further includes a step of forming a second indium/tin oxide (ITO) layer as disconnected islands distributed over the amorphous silicon (α-Si) resistive layer and covered by the polyaniline (PANI) layer.

In a preferred embodiment, the inorganic resistive layer 215 may be a layer of amorphous silicon. This resistive layer may also be an amorphous indium/tin oxide (ITO) or indium/zirconium oxide (IZO) layer, or other type of thin film resistive layer. The sheet resistance is between $10^3$ to $10^8$ ohms/cm$^2$. The ITO islands may be formed as squares or with hexagonal shapes. The ITO islands have a layer thickness ranging between 10 to 100 micrometers. The distances between the adjacent islands are ten time or more than the thickness of the thickness of the α-Si resistive layer 215.

Figure 5A:
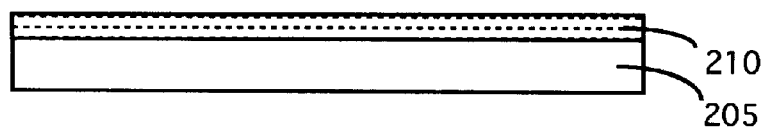
FIGS. 5A to 5F are a series of cross sectional views for showing the processing steps for manufacturing an organic light-emitting diode of FIG. 4.
Figure 5B:
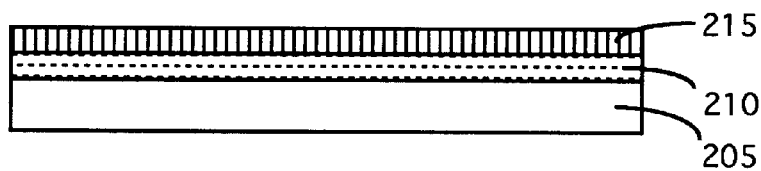
Figure 5C:
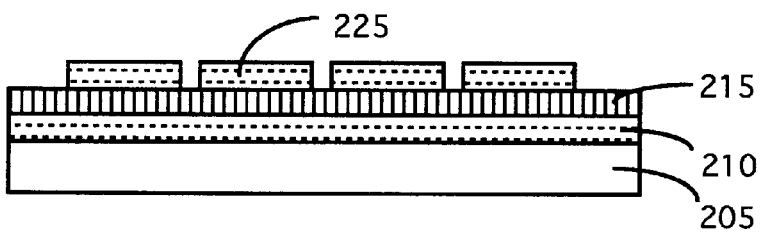
Figure 5D:
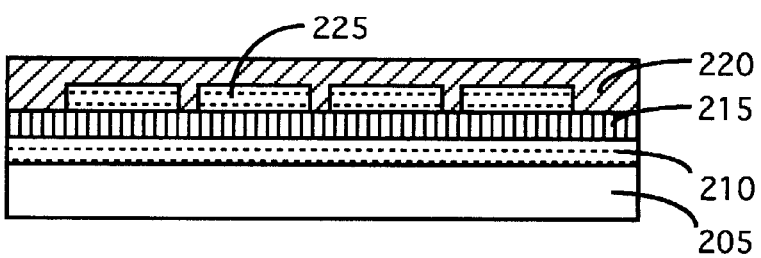
Figure 5E:
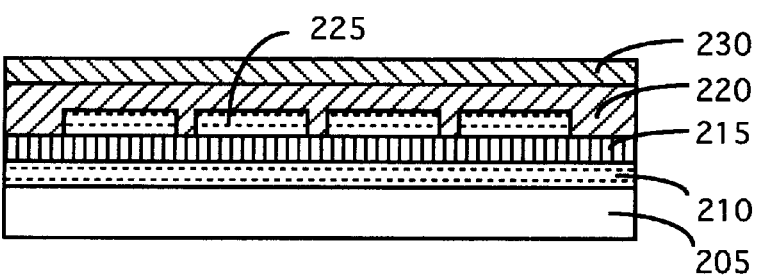
Figure 5F:
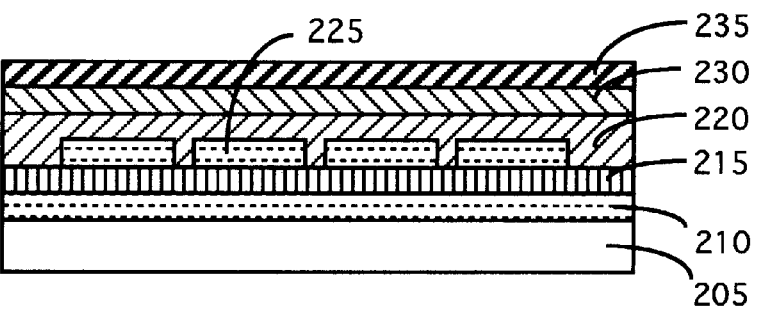

FIGS. 5A to 5E show the processing steps for manufacturing a light-emitting diode of FIG. 4. In FIG. 5A, an ITO layer 210 is formed on the glass substrate 205 by applying a sputtering deposition process. Then, in FIG. 5B, a PVD or a PECVD process is employed to form the inorganic α-silicon layer 215 on top of the ITO layer 210. In FIG. 5C, an ITO layer 225 is formed on top of the inorganic a-silicon layer 215 and the ITO layer 225 is pattered to form a plurality of ITO islands. In FIG. 5D, a spin-on process is applied to coat the PANI layer 220 over the ITO islands 225. Again, in forming the PANI layer 120, as that shown in FIG. 3C, pinholes may be formed (not specifically shown) due to contamination of dust particles. Then a spin-on process is applied again to form an organic light emitting layer 230 as shown in FIG. 5E. Additional pinholes may be formed in the process of forming the organic light-emitting layer 225 (not shown). Then a vacuum evaporation process is applied to form a metal cathode layer 235. The metal cathode layer may fill in the pinholes and contact the inorganic silicon layer 215. With specific resistance, the inorganic α-silicon layer serves as a current limiting layer to limit the current below a maximum current such that damages to the light emitting diode can be prevented. The ITO layers have a larger work function than the α-silicon layer and therefore requiring larger work function for the hole-injection from the ITO layer to the PANI. For this reason, the ITO islands 225 are formed to compensate the difference in hole-injection work functions.

According to above descriptions, this invention also discloses a method for manufacturing an organic light-emitting diode (LED). The method comprises a step of forming an inorganic layer in the organic LED as a current limiting layer. In a preferred embodiment, the step of forming the inorganic layer comprising a step of forming an amorphous silicon (α-Si) resistive layer. In another preferred embodiment, the method further includes steps of forming an indium/tin oxide (ITO) layer coated glass substrate for supporting the organic LED. And, a step of forming the inorganic layer covering the ITO coated glass substrate. In another preferred embodiment, the method further includes a step of forming a polyaniline (PANI) layer covering the inorganic and an organic light emitting layer overlying the PANI layer. And a step of forming a conductive electrode layer covering the light-emitting layer. In anther preferred embodiment, the method further includes a step of forming a second indium/tin oxide (ITO) layer as disconnected islands distributed over the inorganic layer covered by the polyaniline (PANI) layer.

The non-organic α-Si resistive layer is to limit the current for protecting the device. The current is limited under a maximum allowable current under the circumstances when a short circuit situation occurs between the anode and the cathode electrodes. With this current limiting resistive layer, even when an anode electrode is shorted to a cathode electrode, damages to the components of the light-emitting diode can be prevented because the short-circuit current is limited below a maximum allowable current Meanwhile, the display brightness and uniformity will not be adversely affected when the currents passed through the shored spots are limited to a maximum allowable current. In addition to serve a protective function, the resistive layer 115 also enhance a uniform distribution of current flowing between the anode and the cathode electrode. More uniform current density distribution over the entire surface of the LED device is achieved with this inorganic resistive layer serving as a current limiting and distribution layer. The display uniformity is improved because a more uniform current density is achieved. The brightness of display is improved. Furthermore, a more uniform current density distribution also improves and extends the useful life of the LED device by reducing spot degradation caused by continuous operations with uneven current density distributions. The benefit of ITO/α-Si resistive layer/ITO structure is for the work function matching between α-Si and organic material to reduce the operation voltage.

Although the present invention has been described in terms of the presently preferred embodiment, it is to be understood that such disclosure is not to be interpreted as limiting. Various alternations-and modifications will no doubt become apparent to those skilled in the art after reading the above disclosure. Accordingly, it is intended that the appended claims be interpreted as covering all alternations and modifications as fall within the true spirit and scope of the invention.

We claim:

1. An light-emitting diode organic LED supported on an indium/tin oxide (ITO) coated glass substrate comprising:
   an amorphous silicon (α-Si) resistive layer covering said ITO coated glass substrate;
   a polyaniline (PANI) layer covering said amorphous silicon (α-Si) resistive layer and an organic light emitting layer overlying said PANI layer;
   a conductive electrode layer covering said light emitting layer and
   a second indium/tin oxide (ITO) layer formed as disconnected islands distributed over said amorphous silicon (α-Si) resistive layer and covered by said polyaniline (PANI) layer.

2. An organic light-emitting diode (LED) comprising:
   an inorganic layer for functioning as a current limiting layer;
   a polyaniline (PANI) layer covering said inorganic layer and an organic light emitting layer overlying said PANI layer;
   a conductive electrode layer covering said light emitting layer; and
   a second indium/tin oxide (ITO) layer formed as disconnected islands distributed over said inorganic layer and covered by said polyaniline (PANI) layer.

3. A method for forming an organic light-emitting diode (LED) on an indium/tin oxide coated glass substrate comprising:
   forming an amorphous silicon (α-Si) resistive layer for covering said ITO coated glass substrate;
   forming a polyaniline (PANI) layer covering said amorphous silicon (α-Si) resistive layer and an organic light emitting layer overlying said PANI layer;
   forming a conductive electrode layer covering said light emitting layer; and
   forming a second indium/tin oxide (ITO) layer as disconnected islands distributed over said amorphous silicon (α-Si) resistive layer and covered by said polyaniline (PANI) layer.

4. A method for forming an organic light-emitting diode (LED) comprising:
   forming an inorganic layer in said organic LED as a current limiting layer;
   forming a polyaniline (PANI) layer covering said inorganic layer and an organic light emitting layer overlying said PANI layer;
   forming a conductive electrode layer covering said light emitting layer; and
   forming a second indium/tin oxide (ITO) layer as disconnected islands distributed over said inorganic layer covered by said polyaniline (PANI) layer.

* * * * *